(12) United States Patent
Sakaguchi

(10) Patent No.: US 11,077,673 B2
(45) Date of Patent: Aug. 3, 2021

(54) ELECTROSTATIC PRINTING APPARATUS AND ELECTROSTATIC PRINTING METHOD

(71) Applicant: HotaluX, Ltd., Tokyo (JP)

(72) Inventor: Yoshikazu Sakaguchi, Tokyo (JP)

(73) Assignee: HotaluX, Ltd., Tokyo (JP)

( * ) Notice: Subject to any disclaimer, the term of this patent is extended or adjusted under 35 U.S.C. 154(b) by 0 days.

(21) Appl. No.: 16/621,503

(22) PCT Filed: Jun. 4, 2018

(86) PCT No.: PCT/JP2018/021309
§ 371 (c)(1),
(2) Date: Dec. 11, 2019

(87) PCT Pub. No.: WO2018/230375
PCT Pub. Date: Dec. 20, 2018

(65) Prior Publication Data
US 2020/0114658 A1    Apr. 16, 2020

(30) Foreign Application Priority Data

Jun. 13, 2017  (JP) .............................. JP2017-116330

(51) Int. Cl.
*B41J 2/41* (2006.01)
(52) U.S. Cl.
CPC ...................................... *B41J 2/41* (2013.01)
(58) Field of Classification Search
CPC .. B41J 2/41; B41J 2/415; B41J 2/4155; B05B 5/025
See application file for complete search history.

(56) References Cited

U.S. PATENT DOCUMENTS

| 6,127,082 A * | 10/2000 | Humberstone ......... B05B 5/025 118/621 |
| 2006/0056886 A1* | 3/2006 | Ohishi ................... B41J 13/025 399/322 |
| 2015/0303151 A1* | 10/2015 | Kobayashi .............. B29C 33/58 174/261 |

FOREIGN PATENT DOCUMENTS

| JP | 11-300975 A | 11/1999 |
| JP | 2004-314619 A | 11/2004 |
| JP | 2007-035920 A | 2/2007 |
| JP | 2013-226683 A | 11/2013 |
| WO | 2014/083782 A1 | 6/2014 |

OTHER PUBLICATIONS

International Search Report for PCT/JP2018/021309 dated Aug. 28, 2018 [PCT/ISA/210].

* cited by examiner

*Primary Examiner* — Scott A Richmond
(74) *Attorney, Agent, or Firm* — Sughrue Mion, PLLC

(57) ABSTRACT

The present invention provides an electrostatic printing apparatus that can produce a conductive transparent electrode substrate for use in an organic EL device or the like, which is inexpensive and highly reliable. The electrostatic printing apparatus of the present invention includes a power supply (13), a conductive ejection unit (11) that ejects an ink for forming an insulating film to a target electrode (22), a control unit (12) that applies a bias voltage to the conductive ejection unit (11), and a pulse control unit (14) that applies a pulse voltage to the target electrode (22).

12 Claims, 3 Drawing Sheets

ELECTROSTATIC PRINTING APPARATUS AND ELECTROSTATIC PRINTING METHOD

CROSS REFERENCE TO RELATED APPLICATIONS

This application is a National Stage of International Application No. PCT/JP2018/021309 filed Jun. 4, 2018, claiming priority based on Japanese Patent Application No. 2017-116330, filed on Jun. 13, 2017, the entire disclosure of which is incorporated herein by reference.

TECHNICAL FIELD

The present invention relates to an electrostatic printing apparatus and an electrostatic printing method.

BACKGROUND ART

An organic electro luminescence (EL) device for use in an organic EL illumination apparatus or a passive matrix organic EL display has a basic structure in which an anode, an organic layer including a light emitting layer, and a cathode are laminated on a transparent glass or a flexible resin substrate. Usually, the anode is formed of a transparent conductive material typified by indium tin oxide (ITO), the organic layer is formed of a plurality of layers such as a hole injection and transport layer, an organic light emitting layer, an electron injection and transport layer, and the like, and the cathode is formed of a metal material such as Al, Ag or the like (see, for example, Patent Literature 1).

CITATION LIST

Patent Literature

Patent Literature 1: JP 2007-035920 A

SUMMARY OF INVENTION

Technical Problem

The substrate on which the organic EL device is formed is produced, for example, as follows. First, an ITO film is formed on the surface of a transparent glass or a flexible resin substrate. Next, the ITO is formed in a pattern for desired light emission. Next, a resist resin (insulating film (insulator)) covers the end (edge) of the ITO after patterning for the purpose of short-circuit prevention or the like. When an ultra-thin organic light emitting layer is formed on the end (edge) of the ITO, the electric field between the anode and the cathode becomes uneven, and dielectric breakdown and short-circuiting may occur. Therefore, the end (edge) of the ITO is generally covered with an insulating film (insulator) as described above.

The production process of the substrate is complicated and requires many techniques. First, an ITO film is formed on a transparent substrate by a technique such as sputtering or the like. Next, the ITO is formed into a pattern for desired light emission by a technique such as photolithography or photoetching. Subsequently, an insulating film (insulator) is formed on the end (edge) of the ITO by a photolithography technique using a photoresist. These require film formation by a vacuum apparatus, resist coating, exposure, development, firing, photoetching, and the like, and it is not only difficult to manage a chemical solution and a vacuum, but also a photomask is very expensive, and it takes considerable time and cost to prepare a substrate on which an ITO film is formed. In addition, since an organic layer and a seal need to be formed, an organic EL device becomes a very expensive device, which contributes to the lack of widespread adoption.

With the foregoing in mind, it is an object of the present invention to provide an electrostatic printing apparatus and an electrostatic printing method that can produce a conductive transparent electrode substrate for use in an organic EL device or the like, which is inexpensive and highly reliable.

Solution to Problem

In order to achieve the above object, the present invention provides an electrostatic printing apparatus including: a power supply; a conductive ejection unit that ejects an ink for forming an insulating film to a target electrode; a control unit that applies a bias voltage to the conductive ejection unit; and a pulse control unit that applies a pulse voltage to the target electrode.

The present invention also provides an electrostatic printing method including the steps of: applying a bias voltage to a conductive ejection unit; applying a pulse voltage to a target electrode; and ejecting an ink for forming an insulating film to the target electrode by the conductive ejection unit.

Advantageous Effects of Invention

According to the present invention, it is possible to provide an electrostatic printing apparatus and an electrostatic printing method that can produce a conductive transparent electrode substrate for use in an organic EL device or the like, which is inexpensive and highly reliable.

DESCRIPTION OF EMBODIMENTS

Figure 1:
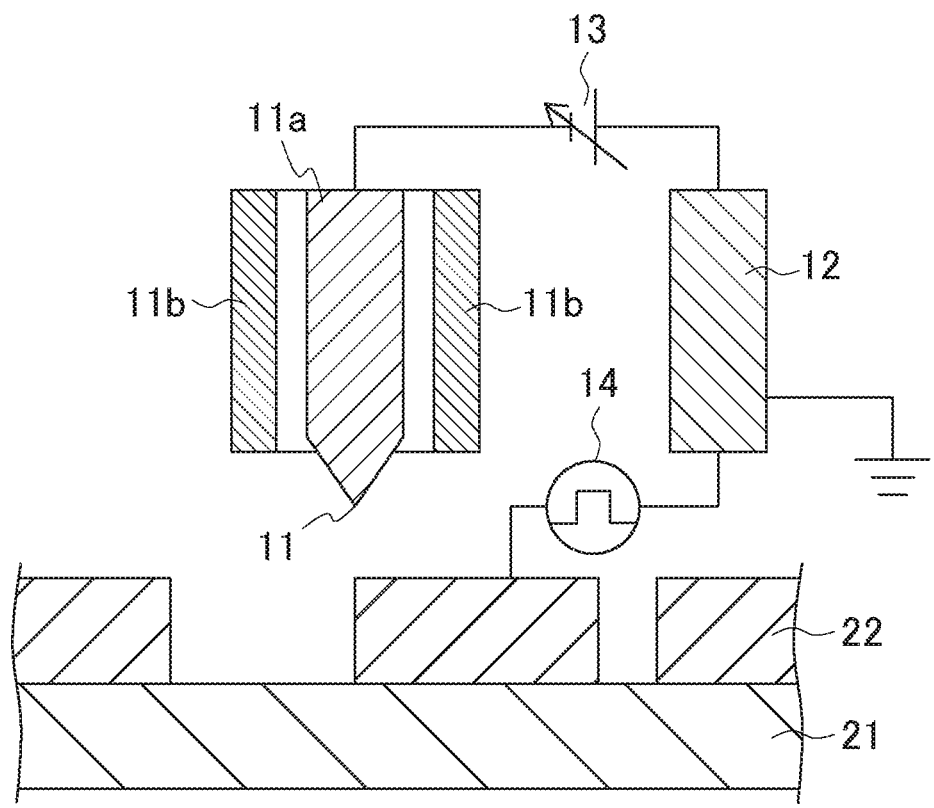
FIG. 1 is a cross-sectional view showing an electrostatic printing apparatus according to the first embodiment.

The electrostatic printing apparatus and the electrostatic printing method of the present invention are described below with reference to the drawings. It is to be noted, however, that the present invention is by no means limited or restricted by the following embodiments. In the following drawings, identical parts are indicated with identical reference signs. Furthermore, for convenience in explanation, the structure of each component shown in the drawings may be appropriately simplified, and the size, the ratio, and the like of components may be schematically shown and different from actual ones. Regarding the descriptions of the embodiments, reference can be made to each other unless otherwise stated.

Figure 5:
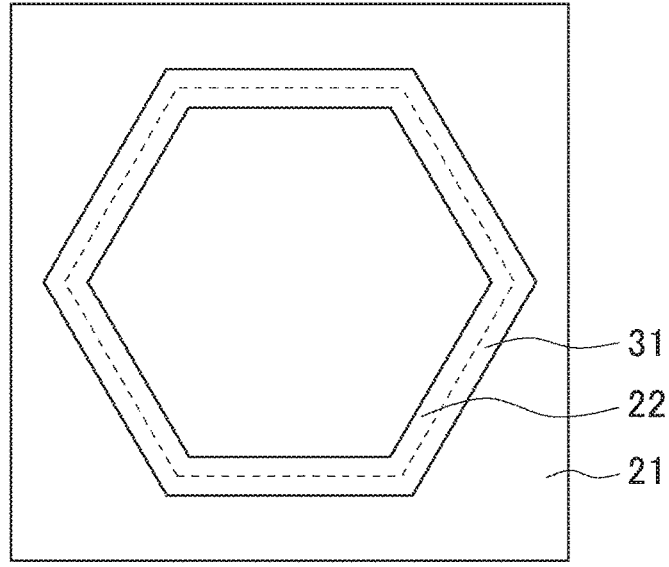
FIG. 5 is a plan view showing an example of forming an insulating film in the present invention.

The electrostatic printing apparatus and the electrostatic printing method of the present invention can be used, for example, for forming an insulating film on the end (edge) of a target electrode formed on a transparent substrate by a technique such as sputtering and patterned by a technique such as photolithography, photoetching, or the like. FIG. 5 is a plan view showing an example of forming an insulating film in the present invention. The present example is an example in which an insulating film 31 is formed on the end (edge) of a target electrode 22 formed on a rectangular transparent substrate 21 and patterned into a hexagonal shape. The shape of the patterned target electrode 22 is not limited to the hexagonal shape as shown in FIG. 5, and may be, for example, any shape corresponding to a pattern for desired light emission such as polygonal shapes including a triangular shape, a square shape, a pentagonal shape, and the like; a circular shape; an elliptical shape; or the like. The number of the target electrodes 22 to be patterned is not particularly limited, and may be one as shown in FIG. 5 or more than one. For example, wirings of 100 or more rectangular target electrodes 22 may be patterned in parallel on the transparent substrate 21. Examples of the material for forming the transparent substrate 21 include glass and flexible resin. As a material for forming the target electrode 22, for example, ITO or the like may be used.

Figure 6A:
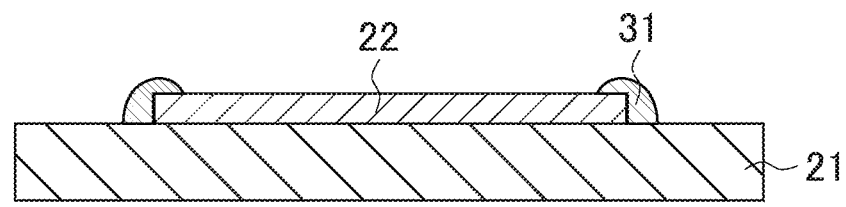
FIGS. 6A to 6D are cross-sectional views showing an example of forming an insulating film in the present invention.
Figure 6B:
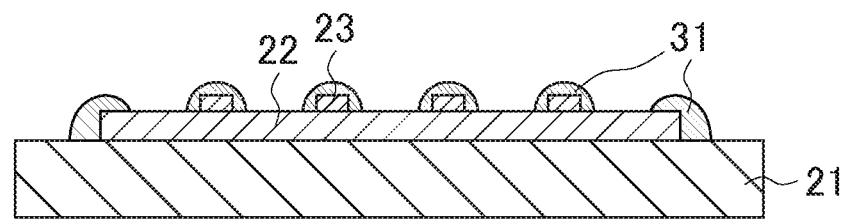
Figure 6C:
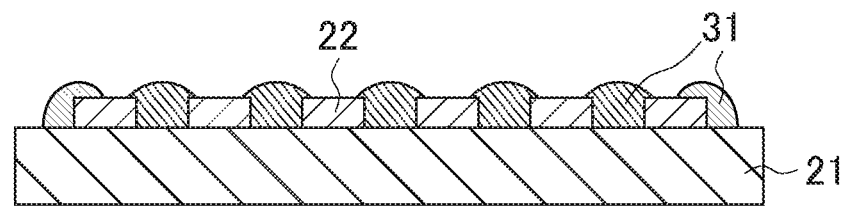
Figure 6D:
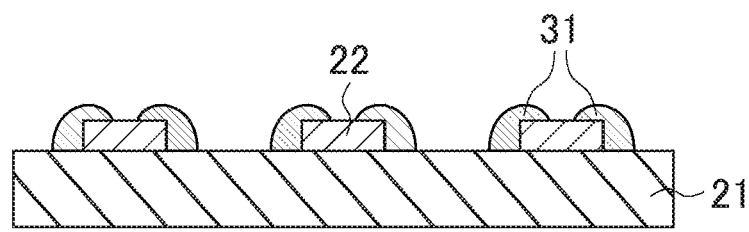

Further, an example of forming an insulating film according to the present invention is shown in the cross-sectional views of FIGS. 6A to 6D. For example, when one target electrode 22 is patterned on the transparent substrate 21 as shown in FIG. 5, the insulating film 31 may be formed so as to cover both ends (edges) of the target electrode 22 as shown in FIG. 6A. For example, when a plurality of auxiliary electrodes 23 are arranged on one target electrode 22 as shown in FIG. 6B, the insulating film 31 may be formed so as to cover both ends (edges) of the target electrode 22 and also to cover each auxiliary electrode 23. In this case, the plurality of auxiliary electrodes 23 also serve as the target electrodes on which the insulating film 31 is to be formed. The auxiliary electrode 23 may be formed on the target electrode 22 by, for example, a technique such as physical vapor deposition (PVD) typified by sputtering, chemical vapor deposition (CVD) typified by plasma-enhanced chemical vapor deposition (PECVD) and atomic layer deposition (ALD), or the like, and patterned by a photoprocess such as photoetching, photolithography, or the like. Examples of the material for forming the auxiliary electrode 23 include Cr (chromium), Mo (molybdenum), Cu (copper), Al (aluminum), Ag (silver), Au (gold), W (tungsten), Ni (nickel), and alloys thereof. Examples of the alloy include Al—Mo (aluminum-molybdenum), Al—Nd (aluminum-neodymium), and Al—Ni (aluminum-nickel). Then, for example, as shown in FIG. 6C, when a plurality of target electrodes 22 are patterned in parallel on the transparent substrate 21, the insulating film 31 may be formed so as to cover the left end (edge) of the left end target electrode 22 and the right end (edge) of the right end target electrode 22, and also to span the adjacent target electrodes 22. Further, for example, as shown in FIG. 6D, when a plurality of target electrodes 22 are patterned on the transparent substrate 21 at intervals, the insulating film 31 may be formed so as to cover both ends (edges) of each target electrode 22. It is to be noted that, the electrostatic printing apparatus and the electrostatic printing method of the present invention can be used for forming an insulating film not only on the end (edge) of the target electrode 22 but also on the target electrode 22 (surface of the target electrode 22).

First Embodiment

FIG. 1 is a cross-sectional view showing an electrostatic printing apparatus of the present embodiment. As shown in FIG. 1, the electrostatic printing apparatus of the present embodiment includes a power supply 13, a conductive ejection unit 11 that ejects an ink for forming an insulating film to a target electrode 22, a control unit 12 that applies a bias voltage to the conductive ejection unit 11, and a pulse control unit 14 that applies a pulse voltage to the target electrode 22. The electrostatic printing apparatus may further include an ink supply unit (not shown in FIG. 1) that supplies the ink to the conductive ejection unit 11. The ink has, for example, an insulating property or a dielectric property. In FIG. 1, the transparent substrate 21 and the target electrode 22 are not the components of the electrostatic printing apparatus, but are objects on which an insulating film is to be printed by the electrostatic printing apparatus.

Figures 2A, 2B:
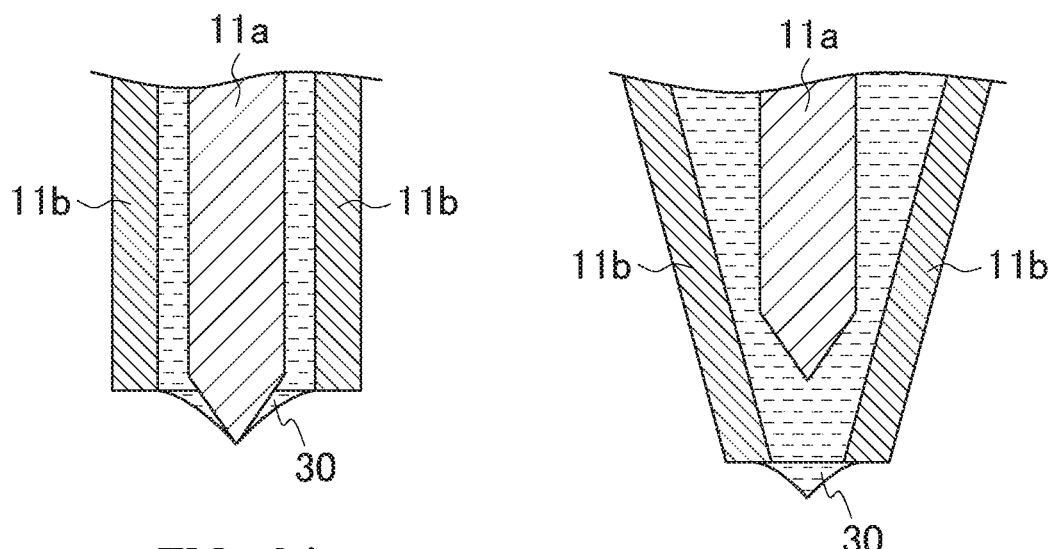
FIGS. 2A and 2B are cross-sectional views each showing an example of a conductive ejection unit of the electrostatic printing apparatus according to the first embodiment.

The configuration of the conductive ejection unit 11 is not limited as long as the ink can be ejected to the target electrode 22 and a bias voltage can be applied. FIG. 2A shows an enlarged cross-sectional view of the target electrode 22 side of the conductive ejection unit 11 shown in FIG. 1. As shown in FIGS. 1 and 2A, the conductive ejection unit 11 of this example includes a cylindrical peripheral electrode 11b and an ejection electrode 11a disposed therein. The ejection electrode 11a has a sharp tip on the target electrode 22 side, and the leading edge of the sharp tip of the ejection electrode 11a protrudes from the lower end of the peripheral electrode 11b. The peripheral electrode 11b also has a function of storing and holding the ink 30 supplied from the ink supply unit, for example. When the conductive ejection unit 11 is configured as in the present example, as described below, by providing a potential difference between the ejection electrode 11a and the target electrode 22, the ink surface at the tip of the ejection electrode 11a is raised, and the ink 30 is ejected. At this time, since the electric field can be concentrated on the tip of the ejection electrode 11a, the ink 30 can be stably ejected without generating satellites. Further, since the variation in the amount of droplets (amount of ink) ejected at once can be further reduced, the meniscus (ink surface shape) of the tip of the ejection electrode 11a can be maintained in a more suitable state. As shown in FIG. 2B, the conductive ejection unit 11 may be configured such that the diameter of the opening of the periphery electrode 11b on the target electrode 22 side is smaller than the diameter of the opening of the periphery electrode 11b on the opposite side, and the lower end of the peripheral electrode 11b protrudes from the tip of the ejection electrode 11a, so that the peripheral electrode 11b also functions as an ejection guide for the ink 30. In the conductive ejection unit 11, the ejection electrode 11a may be grounded without providing the peripheral electrode 11b. Examples of the material for forming the conductive ejection unit 11 (e.g., the ejection electrode 11a and the peripheral electrode 11b) include Ni alloys such as Ni—Cr, Ni—Mo, Ni—Ru, and the like; and Fe alloys such as Fe—Ni—Cr, Fe—Ni—Cr—Mo, and the like; and Au.

While the electrostatic printing apparatus shown in FIG. 1 includes one conductive ejection unit 11, the electrostatic printing apparatus of the present invention may include a plurality of conductive ejection units 11. In a case where there are plural conductive ejection units 11, it is possible to simultaneously eject the ink 30 to a plurality of target electrodes 22 or a plurality of positions of one target electrode 22. In a case where there is one conductive ejection unit 11, the electrostatic printing apparatus may include a slide mechanism of the conductive ejection unit 11 or the transparent substrate 21 and the target electrode 22 that allows the conductive ejection unit 11 to move directly above the insulating film formation site (e.g., end (edge)) of the target electrode 22.

The power supply 13 applies a bias voltage to the conductive ejection unit 11 and a pulse voltage to the target electrode 22 via the control unit 12 and the pulse control unit 14. As the power supply 13, the control unit 12, and the pulse control unit 14, conventionally known ones may be used. As shown in FIG. 1, the control unit 12 may be grounded. In the electrostatic printing apparatus, since no pulse voltage is applied to the conductive ejection unit 11, the conductive ejection unit 11 is not deteriorated like the Spindt-type electrode of a field emission display (FED), and the lifetime of the conductive ejection units 11 is extended.

In the electrostatic printing apparatus, in addition to the application of the bias voltage to the conductive ejection unit 11, by applying the pulse voltage to the opposing target electrode 22, a fringe electric field is generated at the end (edge) of the target electrode 22, and the ink 30 flies toward the target electrode 22 along the electric line of force between the conductive ejection unit 11 and the target electrode 22. As a result, the self-alignment of the landing position of the ink 30 is achieved, and the positional accuracy is increased. Therefore, according to the electrostatic printing apparatus, uneven coating and positional deviation of the ink 30 are greatly suppressed, and the insulating film 31 having a stable shape can be formed on the end (edge) of the target electrode 22. As a result, according to the electrostatic printing apparatus, a highly reliable conductive transparent electrode substrate can be produced. In addition, in a case where there are plural conductive ejection units 11, when a pulse voltage for the ejection of ink 30 is applied to the conductive ejection units 11, the electric fields of the adjacent conductive ejection units 11 interfere with each other as the distance between the adjacent conductive ejection units 11 comes closer, and this may change the ejection direction of the ink 30 so that the ink 30 does not land at the desired landing position. On the other hand, according to the electrostatic printing apparatus, since the pulse voltage is applied to the target electrode 22 instead of the conductive ejection unit 11, there is no crosstalk due to the electric field of the adjacent conductive ejection units 11, and the fixing of the ink 30 to the conductive ejection unit 11 and the deviation of the landing position of the ink 30 can be eliminated. Further, according to the electrostatic printing apparatus, for example, since the formation of the insulating film 31 can be performed by one process of coating and drying (firing), it is possible to reduce the number of steps, shorten the tact time, and greatly reduce the cost associated therewith. As a result, according to the electrostatic printing apparatus, an inexpensive conductive transparent electrode substrate can be produced. Further, according to the electrostatic printing apparatus, since the insulating film 31 can be directly formed on the target electrode 22 without using a photoprocess such as photoetching and photolithography used in producing a general conductive transparent electrode substrate, an inexpensive conductive transparent electrode substrate can be produced from this point as well. The conductive transparent electrode substrate can be used for, for example, an organic EL device, an organic light emitting transistor, an organic solar cell, or the like.

According to the electrostatic printing apparatus, for example, the ejection amount of the ink 30 can be adjusted by changing at least one of the amplitude and the pulse width of the pulse potential of the target electrode 22. As an example, the potential difference between the conductive ejection unit 11 and the target electrode 22 can be set to 1000V, and the amplitude of the pulse voltage applied to the target electrode 22 can be set to 500V.

The composition of the ink 30 is not particularly limited. By way of example, the ink 30 may be composed of 20 to 60 wt % binder resin (e.g., PMMA (polymethyl methacrylate), 5 to 20 wt % monomer (e.g., methyl methacrylate, perfluoroethyl methacrylate, etc.), 30 to 70 wt % solvent (e.g., propylene glycol monomethyl ether acetate, etc.), and 0.01 to 1 wt % positive or negative electrification control agent (e.g. charge control agent such as CCA). Examples of the positive electrification control agent (charge control agent) include a nigrosine dye, an azine dye, a copper phthalocyanine pigment, a quaternary ammonium salt, a polymer having such a side chain, and a compound containing many nitrogen atoms such as melamine, benzoguanamine, and the like. Examples of the negative electrification control agent (charge control agent) include a metal complex salt of a monoazo dye, salicylic acid, naphthoic acid, a metal complex salt of a dicarboxylic acid, and a copper phthalocyanine pigment. In the present invention, since the target electrode 22 induces the ink 30 to the landing position by applying the pulse voltage to the target electrode 22, it is not necessary to increase the charge amount of the ink 30. Therefore, the production cost of the ink 30 can be suppressed. In addition, since it is not necessary to apply a high voltage to the ink 30 in order to impart charging, deterioration of the composition component of the ink 30 and deterioration of characteristics such as electrification characteristics and dispersibility of the ink 30 can be suppressed. Further, since it is not necessary to increase the charge amount of the ink 30, the bias voltage to be applied to the conductive ejection unit 11 can be reduced, and from this point as well, the deterioration of the conductive ejection unit 11 is suppressed and the lifetime thereof is extended.

Second Embodiment

Figure 3:
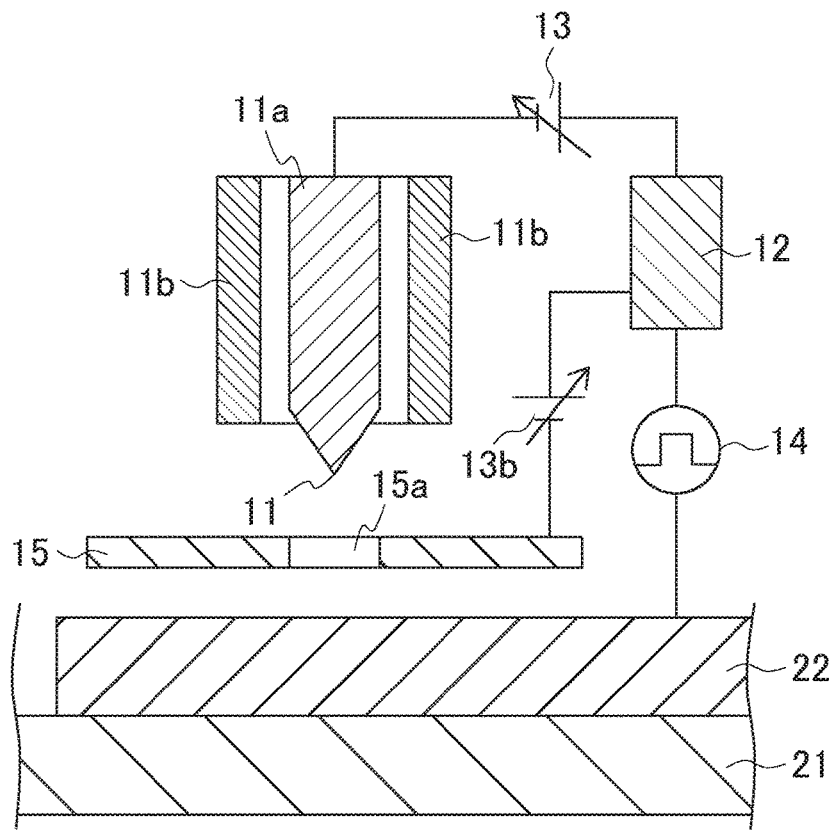
FIG. 3 is a cross-sectional view showing an electrostatic printing apparatus according to the second embodiment.

FIG. 3 is a cross-sectional view showing the electrostatic printing apparatus of the present embodiment. As shown in FIG. 3, the electrostatic printing apparatus of the present embodiment is the same as the electrostatic printing apparatus of the first embodiment shown in FIG. 1, except that the electrostatic printing apparatus of the present embodiment further includes a grid 15 and a second power supply 13b. It is to be noted that FIG. 3 shows a case where an insulating film is formed on the target electrode 22 (the surface of the target electrode 22) instead of the end (edge) of the target electrode 22. The grid 15 is disposed between the conductive ejection unit 11 and the target electrode 22. The second power supply 13b is connected to the grid 15 and the control unit 12.

As shown in FIG. 3, for example, when the insulating film is formed on the target electrode 22 (the surface of the target electrode 22), there is a possibility that the fringe electric field of the target electrode 22 is narrowed and the accuracy of landing of the ink 30 is lowered. Even in such a case, as shown in FIG. 3, if the grid 15 for regulating the electric field is provided between the conductive ejection unit 11 and the target electrode 22, it is possible to suppress the ink 30 from landing on an unintended place.

Figure 4A:
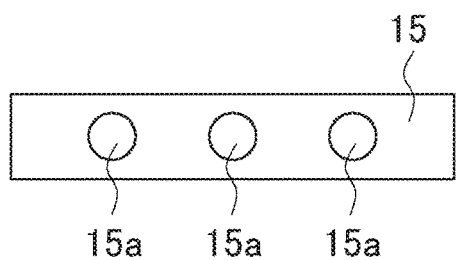
FIGS. 4A and 4B are plan views each showing an example of a grid of the electrostatic printing apparatus according to the second embodiment.
Figure 4B:
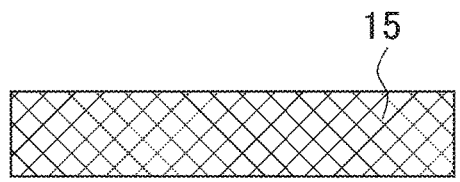

As shown in FIG. 3, for example, the grid 15 has an opening 15a through which the flying ink 30 can pass, and has an electrode structure to which a grid voltage can be applied. However, the shape of the grid 15 is not limited to the example shown in FIG. 3. For example, as shown in the plan view of FIG. 4A, the grid 15 may have a plurality of (three in FIG. 4A) openings 15a, or may have a wire shape as shown in the plan view of FIG. 4B. The grid 15 functions as an electrostatic blocking member (guard ring) by blocking the positions of ejection and flight of the ink 30 from the external electric field, enables the electric field of the conductive ejection unit 11 and the target electrode 22 to be accurately controlled, and enables the erroneous ejection of the ink 30 to be prevented by setting the electric potential.

In the electrostatic printing apparatus of the present embodiment, the potential difference between the conductive ejection unit 11 and the grid 15 and the potential difference between the grid 15 and the target electrode 22 are not particularly limited. As an example, the potential difference between the conductive ejection unit 11 and the grid 15 may be 800V, and the potential difference between the grid 15 and the target electrode 22 may be 300V. In the electrostatic printing apparatus of the present embodiment, the amplitude of the pulse voltage applied to the target electrode 22 is, for example, the same as that in the electrostatic printing apparatus of the first embodiment.

While the present invention has been described above with reference to illustrative embodiments, the present invention is by no means limited thereto. Various changes and variations that may become apparent to those skilled in the art may be made in the configuration and specifics of the present invention without departing from the scope of the present invention.

INDUSTRIAL APPLICABILITY

According to the present invention, it is possible to produce a conductive transparent electrode substrate which is inexpensive and highly reliable. The conductive transparent electrode substrate can be used, for example, in a wide range of applications such as organic EL devices, organic light emitting transistors, organic solar cells, and the like.

REFERENCE SIGNS LIST

11: conductive ejection unit
11a: ejection electrode
11b: peripheral electrode
12: control unit
13: power supply
13b: second power supply
14: pulse control unit
15: grid
15a: opening
21: transparent substrate
22: target electrode
30: ink
31: insulating film

The invention claimed is:

1. An electrostatic printing apparatus comprising:
a conductive ejection unit that ejects an ink for forming an insulating film to a target electrode, the conductive ejection unit including a cylindrical peripheral electrode and an ejection electrode disposed in the cylindrical peripheral electrode;
a control unit that applies a bias voltage to the conductive ejection unit; and
a pulse control unit that applies a pulse voltage to the target electrode.

2. The electrostatic printing apparatus according to claim 1, wherein
the ejection electrode has a sharp tip on a target electrode side.

3. The electrostatic printing apparatus according to claim 1, further comprising:
a grid that is disposed between an ejection side of the conductive ejection unit and the target electrode; and
a second power supply, that is connected to the grid, the second power supply applying a voltage to the grid.

4. The electrostatic printing apparatus according to claim 1, further comprising:
a plurality of conductive ejection units.

5. The electrostatic printing apparatus according to claim 1, wherein
the target electrode is at least one of an indium tin oxide electrode or an auxiliary electrode.

6. The electrostatic printing apparatus according to claim 1, which is for producing a conductive transparent electrode substrate for use in an organic EL device, an organic light emitting transistor, or an organic solar cell.

7. The electrostatic printing apparatus according to claim 1, wherein
the pulse control unit is connected between the control unit and the target electrode.

8. The electrostatic printing apparatus according to claim 1, further comprising: a power supply, that is connected to the conductive ejection unit and the control unit.

9. An electrostatic printing method comprising:
applying a bias voltage to a conductive ejection unit that includes a cylindrical peripheral electrode and an ejection electrode disposed in the cylindrical peripheral electrode;
applying a pulse voltage to a target electrode; and
supplying the conductive ejection unit with an ink for forming an insulating film to the target electrode by the conductive ejection unit.

10. The electrostatic printing method according to claim 9 further comprising:
using an indium tin oxide electrode, or an indium tin oxide electrode and an auxiliary electrode as the target electrode.

11. The electrostatic printing method according to claim 9 further comprising:
disposing a grid between an ejection side of the conductive ejection unit and the target electrode.

12. An electrostatic printing method comprising:
applying a bias voltage to a conductive ejection unit that includes a cylindrical peripheral electrode and an ejection electrode disposed in the cylindrical peripheral electrode;
applying a pulse voltage to the target electrode; and
supplying the conductive ejection unit with an ink for forming an insulating film to the target electrode on a substrate in order to produce a conductive transparent electrode substrate for use in an organic EL device, an organic light emitting transistor, or organic solar cell.

* * * * *